(12) United States Patent
Torii et al.

(10) Patent No.: US 6,881,657 B2
(45) Date of Patent: Apr. 19, 2005

(54) SEMICONDUCTOR DEVICE AND METHOD FOR MANUFACTURING SEMICONDUCTOR DEVICE

(75) Inventors: Kazuyoshi Torii, Tsukuba (JP); Riichirou Mitsuhashi, Tsukuba (JP); Atsushi Horiuchi, Tsukuba (JP)

(73) Assignee: Semiconductor Leading Edge Technologies, Inc., Ibaraki (JP)

( * ) Notice: Subject to any disclaimer, the term of this patent is extended or adjusted under 35 U.S.C. 154(b) by 0 days.

(21) Appl. No.: 10/889,100

(22) Filed: Jul. 13, 2004

(65) Prior Publication Data

US 2005/0014352 A1 Jan. 20, 2005

(30) Foreign Application Priority Data

Jul. 16, 2003 (JP) .......................................... 2003-197954

(51) Int. Cl.[7] .............................................. H01L 21/44
(52) U.S. Cl. ....................... 438/591; 438/258; 257/192; 257/351
(58) Field of Search ............................... 438/258, 591; 257/192, 351

(56) References Cited

U.S. PATENT DOCUMENTS 6,228,697 B1    5/2001   Furukawa et al.
6,333,223 B1   12/2001   Moriwaki et al.
6,376,316 B1    4/2002   Shukuri et al.
6,773,994 B1 *  8/2004   Chittipeddi et al. ........ 438/268
2002/0088971 A1 * 7/2002  Tezuka et al. ................ 257/19
2002/0185676 A1 * 12/2002 Momose ...................... 257/327
2003/0139026 A1 * 7/2003  Lucovsky .................... 438/591
2003/0181005 A1 * 9/2003  Hachimine et al. ......... 438/231
2004/0191991 A1 * 9/2004  Ikeda et al. ................. 438/258

FOREIGN PATENT DOCUMENTS

JP       2000-100966       4/2000
JP       2002-164439       7/2002

* cited by examiner

*Primary Examiner*—Matthew Smith
*Assistant Examiner*—Victor V Yevsikov
(74) *Attorney, Agent, or Firm*—Leydig, Voit & Mayer, Ltd.

(57) ABSTRACT

In a method for forming a semiconductor device, the major surface of a substrate is separated into a first element region for forming a first field-effect transistor and a second element region for forming a second field-effect transistor. A silicon nitride film is formed in each of the first and second element regions. Thereafter, the silicon nitride film formed in the second element region is removed, and the substrate is subjected to heat treatment in an ambient that contains nitrogen oxide. Thereby, the silicon nitride film in the first element region is oxidized to form an oxynitride film, and a silicon oxynitride film is formed in the second element region. Thereafter, a high-dielectric-constant film is formed on the silicon oxynitride films in each of the first and second element regions.

14 Claims, 8 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing a semiconductor device. More specifically, the present invention relates to a semiconductor device having a plurality of transistors comprising gate insulating films of different film thickness, and a method for manufacturing such a semiconductor device.

2. Background Art

Concurrent with the advance of the down-sizing technology of semiconductor integrated circuits in recent years, the dimension of an element has been reduced, and a larger number of elements have been able to be mounted in a chip. Therefore, an integrated-circuit device referred to as SoC (system on chip) that can individually realize functions conventionally realized using a plurality of element has been widely used.

In the logic circuit portion of an SoC, it is required to lower the driving voltage for reducing power consumption. At the same time, in order to prevent the lowering of the driving current due to the reduction of the driving voltage, the thickness of the gate insulating film of an MOSFET (metal oxide semiconductor field effect transistor) has been reduced.

On the other hand, the MOSFET used in the peripheral circuit portions accompanying inputs and outputs must be directly driven by an external voltage. Therefore, a high withstand voltage is required in the MOSFET used in the peripheral circuit portions, and a gate insulating film having a large film thickness to some extent is required. For example, a thick gate insulating film having a thickness of about 6.0 nm to 10 nm has been used in a high-withstand-voltage 3.3V MOSFET.

When a logic circuit portion and a peripheral circuit portion are formed in a semiconductor device, the gate insulating films of the different thickness require to be formed in these circuit portions on a substrate. One of the methods for forming gate insulating films of different thickness is as follows:

First, a silicon oxide film of a thickness equivalent to the difference between the thickness of the thick gate insulating film of the high-withstand-voltage MOSFET for the peripheral circuit and the thickness of the thin gate insulating film of the MOSFET for the logic circuit. Thereafter, the silicon oxide film on the portion for forming the MOSFET for the logic circuit is selectively removed. Then, heat-treatment is performed to grow the silicon oxide film by the thickness of the gate insulating film of the MOSFET for the logic circuit. At this time, the gate oxide film of the high-withstand-voltage MOSFET for the peripheral circuit is also grown. Thus, the gate insulating films having different thickness are formed (for example, refer to Japanese Patent Laid-Open No. H11-177047 (1999) and No. H11-289061 (1999)).

As another method, the method as described below has also been proposed. First, in the same manner as the process for forming an ordinary MOSFET, a gate insulating film of a thickness equal to the thickness of the insulating film of the high-withstand-voltage MOSFET for the peripheral circuit, and a gate electrode are formed in each of the logic circuit portion and the peripheral circuit portion. Thereafter, ion implantation and heat treatment for the formation of a diffusion layer are performed. Then, an interlayer insulating film is formed on the entire surfaces of the gate insulating film and the gate electrode. Next, the peripheral circuit portion is coated with a resist film, and the gate electrode and the gate insulating film in the logic circuit side are removed from the interlayer insulating film. Thereby, a trench of the width of the gate electrode is formed in the interlayer insulating film. Then, a thin gate insulating film of the MOSFET for the logic circuit is formed in the trench, and a gate electrode is buried to form an MOSFET for the logic circuit. Here, since the gate insulating film and the gate electrode initially formed in the region for the logic circuit are removed later, these are called dummy gates (for example, refer to Japanese Patent Laid-Open No. 2000-100966 and No. 2000-195966).

With the miniaturization of semiconductor devices in recent years, the further reduction of the thickness of gate insulating films has been demanded. However, in the case when a silicon oxide film is used as a gate insulating film, if the thickness thereof is 2 nm or less, leak current increases resulting in the increase of power consumption. Since such a thin silicon oxide film is formed of several atomic layers, it is difficult to form evenly, and since a strict manufacturing control is required to improve the uniformity of film thickness, mass production becomes difficult.

Therefore, in order to produce finer elements and reduce power consumption, the use of a high-dielectric-constant film (hereafter referred to as high-k film) as a gate insulating film has been studied. The high-k film can be formed thicker than the silicon oxide film, while maintaining the effective film thickness that determines the transistor current sufficiently thin, and can inhibit the increase of power consumption.

As such an SoC, there has been proposed a semiconductor device that uses a high-k film as the gate insulating film of an MISFET (metal insulator semiconductor field effect transistor) for the logic circuit, and a thick silicon oxide film and a high-k film as the gate insulating film for the peripheral circuit. When this semiconductor device is formed, a silicon oxide film is first formed on the entire surface of a substrate using an ordinary method. Thereafter, the silicon oxide film in the region for forming the MISFET for the logic circuit is removed, and then, a high-k film is formed on the entire surface using a CVD method or the like. Thereby, the gate insulating films having different thickness between the peripheral circuit side and the logic circuit side can be formed (for example, refer to Japanese Patent Laid-Open No. 2002-164439).

MISFETs used in the logic circuit portion of SoC are classified into a low operating power (LOP) version that requires relatively high-speed operation, a low stand-by power (LSTP) version, and the like. Some SoC use either an MISFET for LOP or an MISFET for LSTP in the logic circuit portion, and an MISFET for a high withstand voltage in the peripheral circuit portion. In recent years, however, the number of semiconductor devices using both MISFETs for LOP and LSTP in the logic circuit portion, and an MISFET for a high withstand voltage in the peripheral circuit portion is increasing. Such semiconductor devices are useful when used in mobile phones or the like, which require both the operation speed for a long time operated by batteries and high performance, and the demand for such semiconductor devices will further be increased in future.

In such SoC carrying an MISFET for LOP, an MISFET for LSTP, and an MISFET for a high withstand voltage in one chip, the thickness of the gate insulating films in these MISFETs is different from each other. The ITRS (The International Technology Roadmap for Semiconductors) recommends that the EOT (film thickness converted to the thickness of a silicon oxide film) of a gate insulating film of the MISFET for LOP in a 65-nm technology node is 1.0 nm to 1.4 nm, and the EOT of the MISFET for LSTP is 1.2 to 1.6 nm as the target values.

In this case, the difference between the thickness of MISFETs for LOP and LSTP is 0.2 nm to 0.4 nm. When an SoC having both MISFETs for LOP and LSTP is formed, there is considered the use of a method as described above wherein a thermal oxide film is formed, the thermal oxide film in the side to form a thin gate insulating film is removed, and a thermal oxide film is formed again. However, a silicon oxide film easily permeates oxygen, and the film is rapidly grown in the later thermal oxidation. Therefore, the difference in the thickness of gate insulating films between the MISFET for LOP side and the MISFET for LSTP side cannot be controlled to be as small as 0.2 nm to 0.4 nm.

The use of, for example, a method as described above wherein a trench is formed in an interlayer insulating film using a dummy gate, and a high-k film is formed in the trench is also considered. However, it is difficult to control the thickness of the high-k films formed using a CVD (chemical vapor deposition) method so as to have a thickness difference of about 0.2 to 0.4 nm. It is also considered to control the thickness difference utilizing a silicon oxide film as the gate interfacial film formed under the high-k film. However, as described above, it is difficult to control the thickness of a silicon oxide film. Furthermore, the formation of three gate insulating films is required when three kinds of MISFETs, i.e., MISFET for LOP, MISFET for LSTP, and MISFET for high withstand voltage for peripheral circuits; however, in this case, since the formation and removal of the dummy gate must be repeatedly performed, the number of steps increases resulting in lowered productivity. Furthermore, since the high-k film initially formed is undergone, in addition to the heat treatment of the PDA (post deposition annealing) step for itself, heat of the PDA step for the high-k film subsequently formed, it becomes difficult to control the film thickness and to secure reliability.

Alternatively, there can also be considered a method wherein a silicon oxide film is formed on the entire surface of a substrate, the silicon oxide film in the logic-circuit side is removed, and then a high-k film is formed on the entire surface using a CVD method or the like. In this case, however, it is also difficult to form a silicon oxide film of a thickness equivalent to the thickness difference between the insulating films of 0.2 to 0.4 nm.

SUMMARY OF THE INVENTION

Therefore, the present invention proposes the solution of the above-described problems, and it is the object of the present invention to provide a semiconductor device wherein gate insulating films highly controlled their thickness are formed when a plurality of transistors are formed on a chip, even if the difference between the thickness of the gate insulating films is small, and to provide a method for manufacturing such a semiconductor device.

According to one aspect of the present invention, a semiconductor device comprises a substrate, and a first field-effect transistor and a second field-effect transistor formed on the substrate. The fist field-effect transistor includes a first gate insulating film and a first gate electrode. The second field-effect transistor includes a second gate insulating film and a second gate electrode. Each of the first gate insulating film and the second gate insulating film includes a silicon oxynitride film and a high-dielectric-constant film. The equivalent-oxide thickness of the first gate insulating film is thicker than the equivalent-oxide thickness of the second gate insulating film. The high-dielectric-constant film in the first gate insulating film has the same thickness as the high-dielectric-constant film in the second gate insulating film.

According to another aspect of the present invention, in a method for manufacturing a semiconductor device, the major surface of a substrate is separated into a first element region for forming a first field-effect transistor and a second element region for forming a second field-effect transistor. A silicon nitride film is formed on the first element region and the second element region. The silicon nitride film formed on the second element region is removed. The substrate is heated in an atmosphere at least containing nitrogen oxide to oxidize the silicon nitride film formed on the first element region to form an oxynitride film, and to form a silicon oxynitride film on the second element region. A high-dielectric-constant film is formed on the silicon oxynitride film on each of the first element region and the second element region.

Other and further objects, features and advantages of the invention will appear more fully from the following description.

DETAILED DESCRIPTION OF THE PREFERRED EMBODIMENTS

Figure 1:
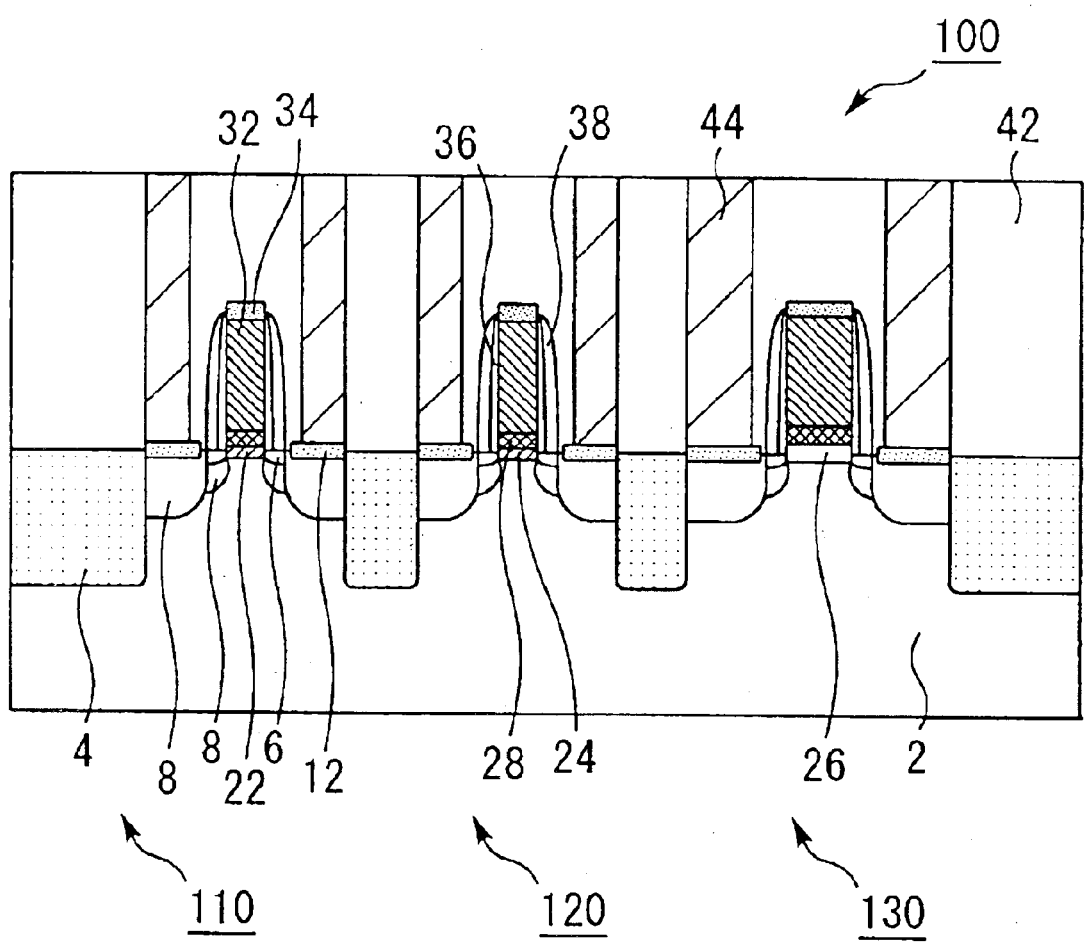
FIG. 1 is a schematic sectional view for illustrating an SoC (system on chip) 100 according to the first embodiments of the present invention.

The embodiments of the present invention will be described below referring to the drawings. In the drawings, the same or like parts will be denoted by the same reference numerals, and the description thereof will be omitted or simplified.

First Embodiment

FIG. 1 is a schematic sectional view for illustrating an SoC (system on chip) 100 according to the first embodiments of the present invention.

As FIG. 1 shows, the SoC 100 is composed of a MISFET (metal insulator semiconductor field effect transistor) 110 for LOP (low operating power) (hereafter referred to as MISFET for LOP 110); an MISFET 120 for LSTP (low stand-by power) (hereafter referred to as MISFET for LSTP 120); and an MISFET 130 for high withstand voltage (hereafter referred to as MISFET for high withstand voltage 130).

The MISFETs for LOP 110, for LSTP 120, and for high withstand voltage 130 are formed in regions of an Si substrate 2 isolated by STI (shallow trench isolation) 4, respectively.

On each region of the Si substrate 2 isolated by STI 4, a source-drain extension 6, which is a diffusion layer having a relatively shallow junction and a low impurity content is formed, and a punch-through stopper 8 is formed underneath the source-drain extension 6. Outside each source-drain extension 6, a source-drain region 10, which is a diffusion layer having a relatively deep junction and a high impurity content is formed. On each source-drain region 10, a nickel silicide (NiSi) layer 12 is formed.

In the MISFET for LOP 110, a silicon oxynitride film 22 is formed as an interfacial gate insulating film in the area sandwiched by source-drain extensions 6 on the Si substrate 2. In the MISFET for LSTP 120, a silicon oxynitride film 24 is formed in the equivalent area. In the MISFET for high withstand voltage 130, a surface-nitrided thermally-oxidized ($SiO_2$) film 26 is formed in the equivalent area. Here, the thickness of the silicon oxynitride film 22 in the MISFET for LOP 110 is about 0.9 to 0.95 nm, and the EOT thereof is about 0.7 nm. The thickness of the silicon oxynitride film 24 in the MISFET for LSTP 120 is about 1.3 nm; and the EOT thereof is about 1.0 nm. Furthermore, the thickness of the thermally-oxidized film 26 is about 5 nm. In short, the silicon oxynitride film 22 for the MISFET for LOP 110 is thinnest, and the thermally-oxidized film 26 for the MISFET for high withstand voltage 130 is thickest.

Here, the EOT is an abbreviation of equivalent-oxide thickness and means an equivalent silicon oxide film thickness to which a thickness of a film is converted.

On each of the silicon oxynitride films 22 and 24 and the thermally-oxidized film 26, the high-k film such as a hafnia ($HfO_2$) film 28 of a thickness of about 3.0 nm, which is a high-k film, is formed. The EOT of the high-k film 28 is about 0.5 nm. In each of MISFET 110, 120, and 130 for LOP, LSTP, and for high withstand voltage, respectively, a high-k film 28 is laminated on the silicon oxynitride films 22 and 24 or the thermally-oxidized film 26, thereby each gate insulating film is formed.

On each high-k film 28, a gate electrode 32 is formed. The surface of the gate electrode 32 is silicided, thereby a nickel silicide layer 34 is formed. The gate length of the gate electrode 32 in the MISFET for LOP 100 is about 35 nm, and the gate length of the gate electrode 32 in the MISFET for LSTP 120 is about 50 nm. The gate length of the gate electrode 32 in the MISFET for high withstand voltage 130 is about 0.4 $\mu$m. On the sidewalls of each gate electrode 32 and the underlying gate insulating film, sidewall spacers 36 and 38 are formed.

An interlayer insulating film 42 is formed on the Si substrate 2 so as to bury each gate insulating film, gate electrode 32, and sidewall spacers 36 and 38 formed as described above, and a contact plug 46 passing through the insulating film 42 and reaching the nickel silicide layer 12 on the source-drain region 10 is formed.

In The SoC 100, as described above, MISFETs 110, 120, and 130 for LOP, LSTP, and for high withstand voltage, respectively, having gate insulating films is different thickness are formed.

Specifically, the MISFET for LOP 110 is a low-power-consumption transistor included the laminated film of the silicon oxynitride film 22 and the high-k film 28 as gate insulating film having a reduced EOT. The MISFET for LSTP 120 is a low-standby-power transistor using the laminated film of the silicon oxynitride film 24 and the high-k film 28 as gate insulating film, controlling the EOT to be low to some extent, and sufficiently securing the effective film thickness. The MISFET for high withstand voltage 130 is a high-withstand-voltage transistor securing the thickness of the thermal oxide film so as to withstand the external high voltage.

Figure 2:
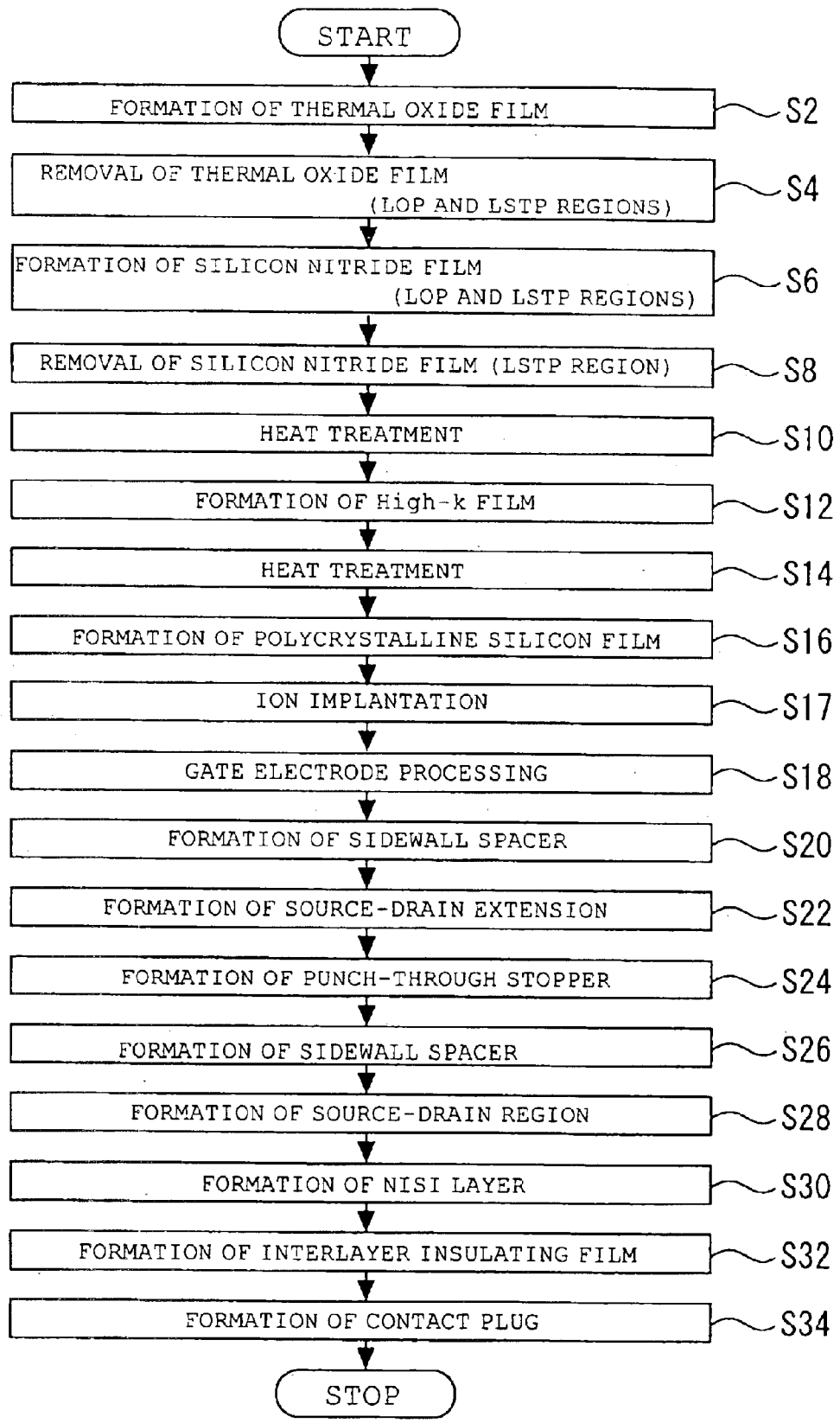
FIG. 2 is a flow diagram for illustrating the method for manufacturing an SoC 100 in the first embodiment of the present invention.

FIG. 2 is a flow diagram for illustrating the method for manufacturing an SoC 100 in the first embodiment of the present invention. FIGS. 3 to 9 are schematic sectional views for illustrating the states in the process of manufacturing the SoC 100.

The method for manufacturing an SoC 100 in the first embodiment of the present invention will be described below referring to FIGS. 1 to 9.

First, an STI 4 is formed on an Si substrate 2, and the Si substrate 2 is divided into a region for forming an MISFET for LOP 110, a region for forming an MISFET for LSTP 120, and a region for forming an MISFET for high withstand voltage 130. For the simplicity of the following description, the region for forming an MISFET for LOP 110 is referred to as the region for LOP, the region for forming an MISFET for LSTP 120 is referred to as the region for LSTP, and the region for forming an MISFET for high withstand voltage 130 is referred to as the region for high withstand voltage.

The implantation of p-type ions for controlling the impurity content in the substrate, heat treatment the impurity diffusion, ion implantation for controlling the threshold voltage, and heat treatment for activation are performed.

Figure 3:
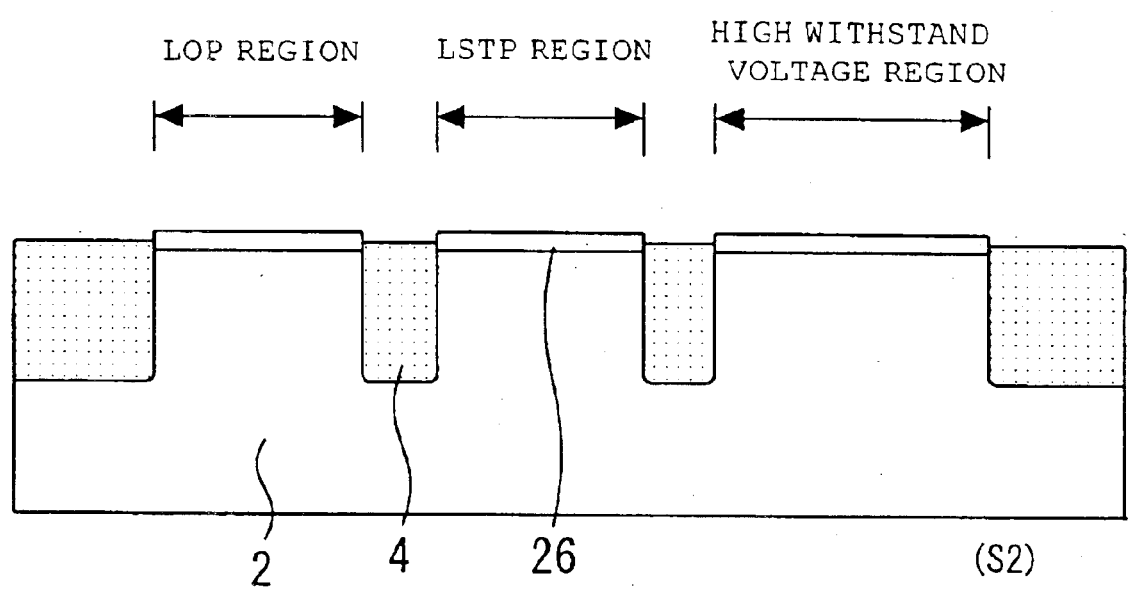
FIGS. 3 to 9 are schematic sectional views for illustrating the states in the process of manufacturing the SoC 100 in the first embodiment of the present invention.

On the Si substrate 2 in each region, a thermal oxide film 26 of a thickness of about 5 nm is formed (Step S2). Next, as FIG. 3 shows, the thermal oxide films 26 on the regions for LOP and LSTP are removed (Step S4). Concretely, after the region for high withstand voltage is coated with a resist mask, wet etching is performed using an aqueous solution of hydrofluoric acid to selectively remove the thermal oxide films 26. Thereafter, the resist mask is removed.

Figure 4:
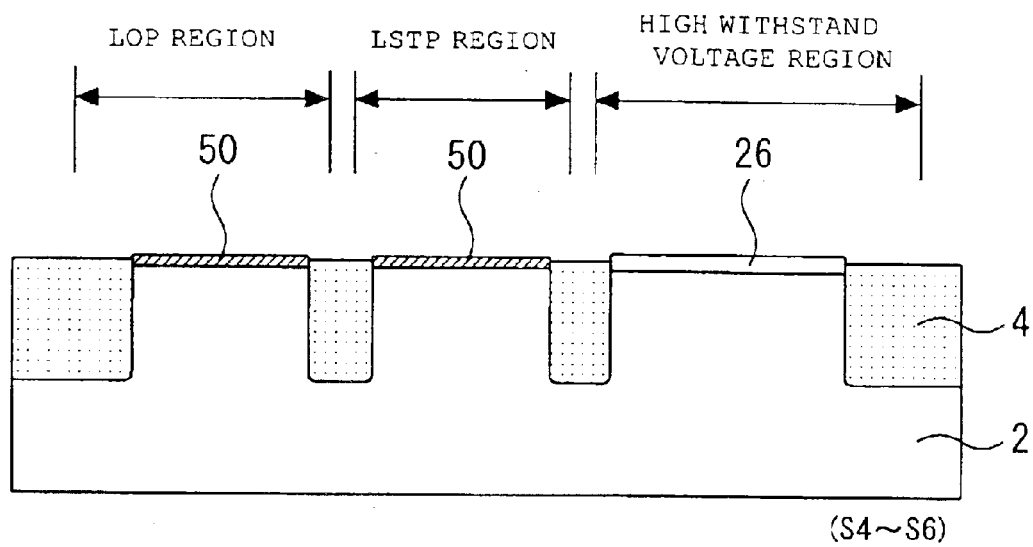

Next, as FIG. 4 shows, a silicon nitride film 50 is formed in each of the regions for LOP and LSTP (Step S6). Here, heat treatment is performed in an ammonia atmosphere at 600° C. to 700° C. for about 30 seconds. Thereby a silicon nitride film of a thickness of about 0.6 nm is formed in each of the regions for LOP and LSTP. At this time, the surface of the thermal oxide films 26 is also simultaneously nitrided. Here, since the thickness of the silicon nitride film 50 can be easily controlled, a thin film of a uniform thickness to some extent can be formed.

Figure 5:
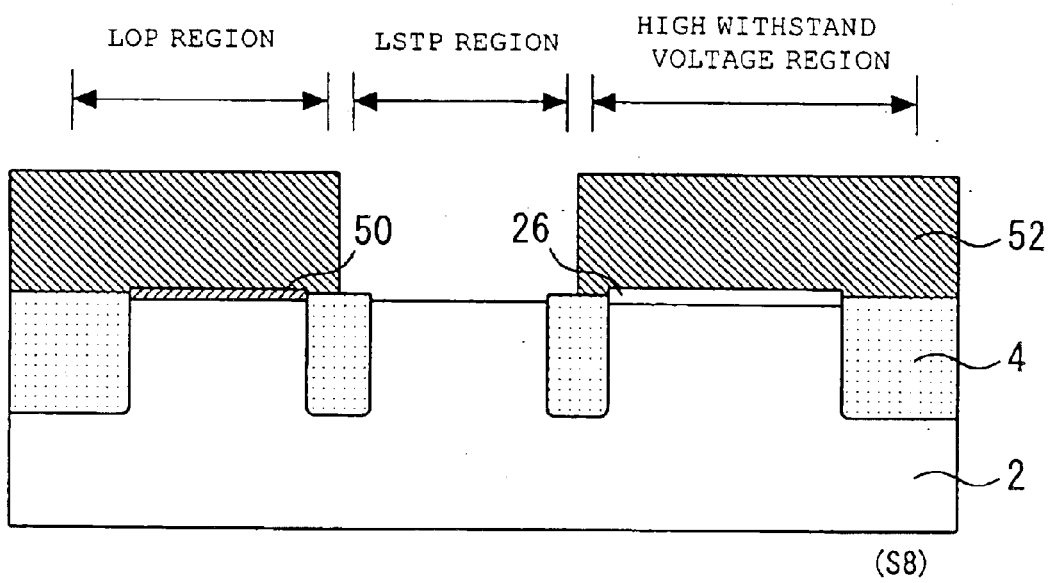

Next, as FIG. 5 shows, the silicon nitride film 50 in the region for LSTP is removed (Step S8). Here, after the regions for LOP and high withstand voltage are coated with a resist mask 52, wet etching is performed to remove the silicon nitride film 50. Thereafter, the resist mask 52 is removed.

Figure 6:
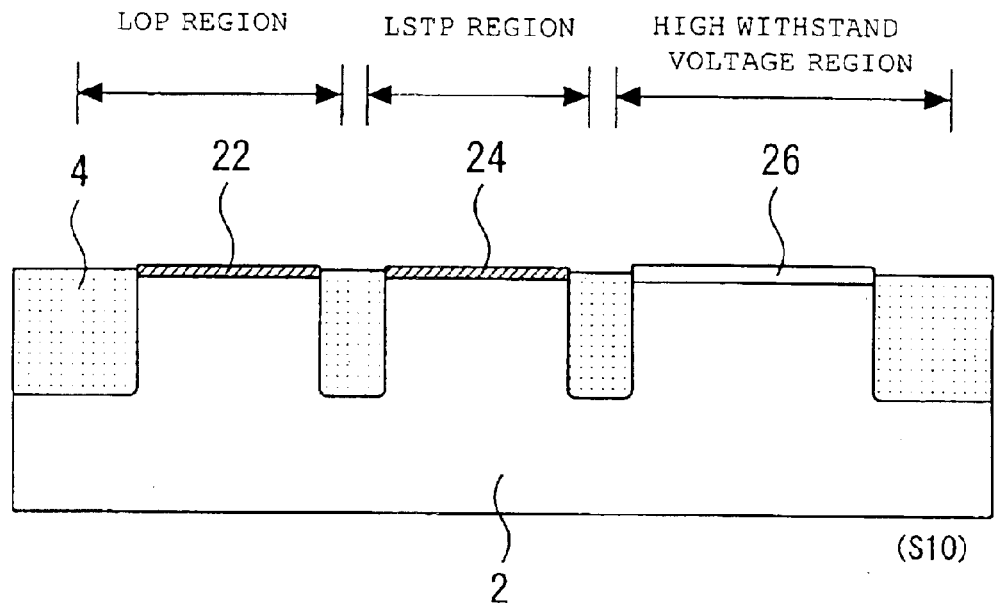

Next, heat treatment is performed in a nitrogen monoxide (NO) environment (Step S10). The temperature of the heat treatment is about 800 to 900° C., and the treating time is about 5 to 60 seconds. Thereby, as FIG. 6 shows, a silicon oxynitride film 24 of a thickness of about 1.3 nm and an EOT of about 1.0 nm is formed in the region for LSTP. The silicon nitride film 50 formed in the region for LOP is oxidized to form a silicon oxynitride film 22 of an EOT of about 0.7 nm. At this time, the nitrogen content in the silicon oxynitride film 22 in the region for LOP is about 15 to 20%, and the nitrogen content in the silicon oxynitride film 24 in the region for LSTP is about 9%. The surface of the thermal oxide films 26 is further nitrided to form a silicon oxynitride film.

Figure 7:
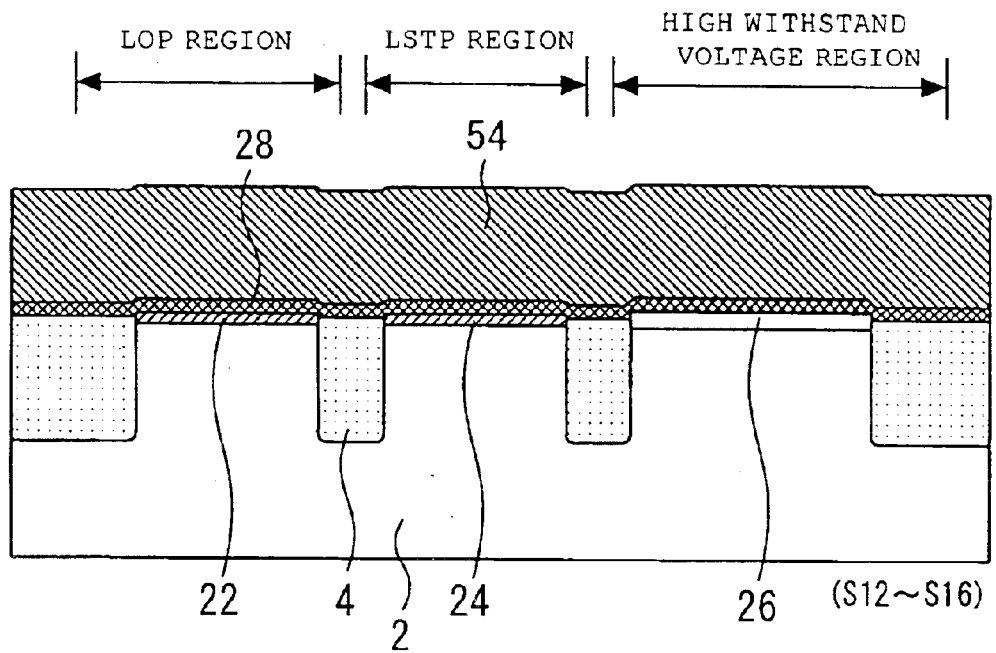

Next, as FIG. 7 shows, a high-k film 28 is formed on the entire surface of the substrate (Step S12). Here, a high-k film of a thickness of 3.0 nm is deposited using hafnium chloride and water as the materials using an ALD (atomic layer deposition) method. Thereafter, heat treatment at about 700° C. is performed in a reduced pressure oxygen atmosphere for about 5 seconds (Step S14).

Next, a non-doped polycrystalline silicon film 54 is formed on the high-k film 28 (Step S16). The non-doped polycrystalline silicon film 54 is a material film for gate electrodes 32, and here, it is deposited to have a thickness of about 120 nm. Thereafter, impurity ions for the gate electrodes are implanted into the non-doped polycrystalline silicon film 54 (Step S17).

Figure 8:
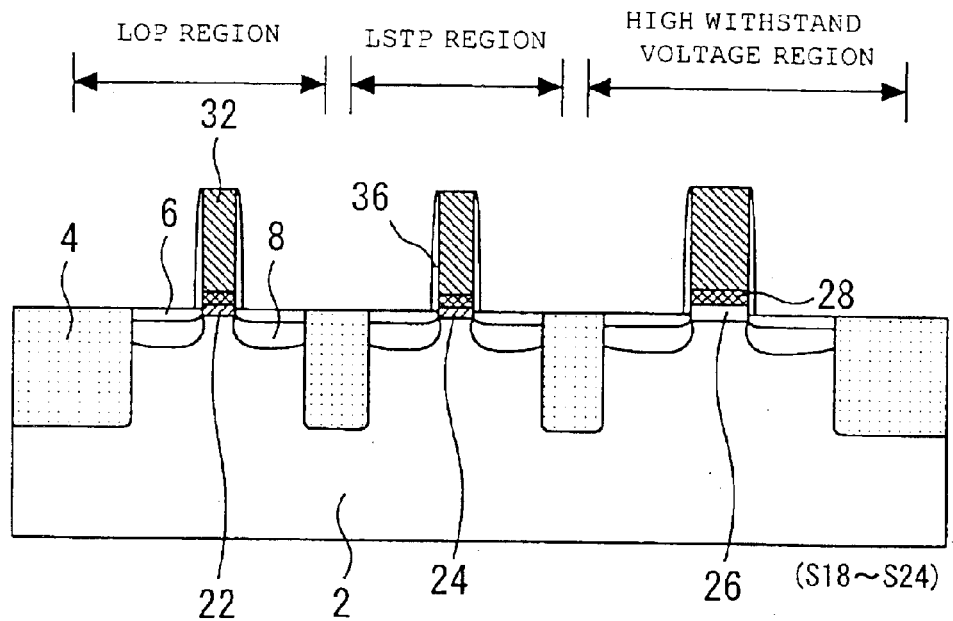

Next, as FIG. 8 shows, the polycrystalline silicon film 54 is processed for a gate electrode 32 of each region (Step S18). Here, a resist mask of a width of the gate electrode is formed on the polycrystalline silicon film 54 using a conventional method, and etching is performed using the resist mask to process the polycrystalline silicon film 54 and the high-k film 28 to have the width of the gate electrode 32. Thereby, a gate electrode 32 and a gate insulating film are formed in each of the regions for LOP, LSTP, and high withstand voltage.

Next, on the sidewalls of each gate electrode 32 and each underlying gate insulating film of regions for LOP, LSTP, and high withstand voltage, sidewall spacers 36 are formed (Step S20). Concretely, the sidewall spacers 36 are formed by depositing a silicon nitride film of a thickness of about 5 nm so as to coat each gate electrode 32 and the like, and performing etch back to the silicon nitride film.

Next, a source-drain extension 6 is formed in each of regions for LOP, LSTP, and high withstand voltage (Step S22). Here, As ions are implanted using an implanting energy of 2 keV and a dose of $3 \times 10^{15}/cm^2$. At this time, the gate electrode 32 and the sidewall spacer 36 in each region are used as the mask. Thereafter, B ions are implanted to form punch-through stoppers 8 of a p-conductivity type (Step S24).

Figure 9:
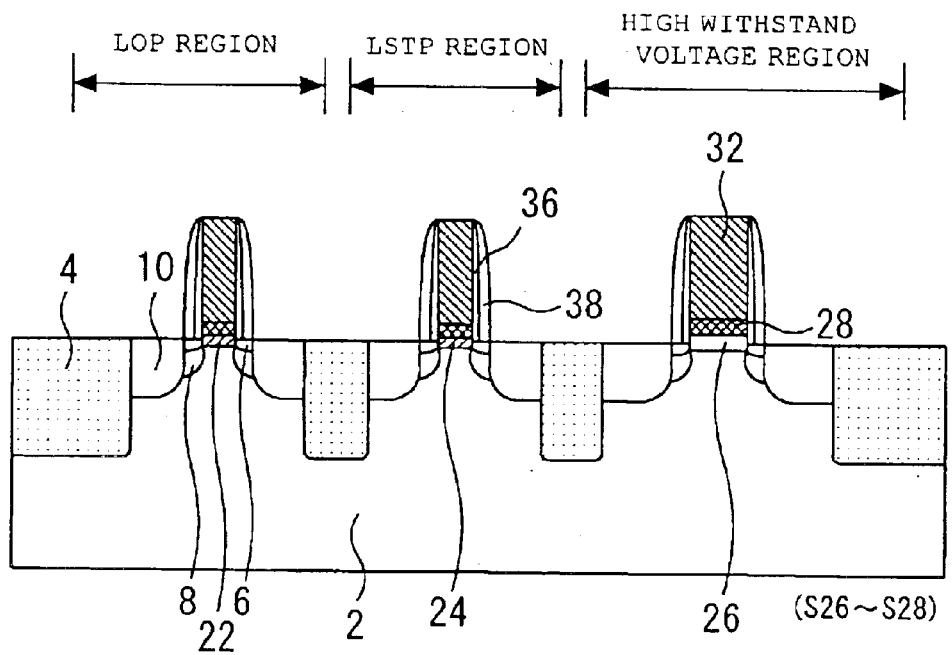

Next, as FIG. 9 shows, sidewall spacers 38 are further formed on the sidewall spacers 36 (Step S26). Concretely, a silicon oxide film, a silicon nitride film, and a silicon oxide film are deposited in this order on the entire surface of the substrate. At this time, the thicknesses of the films are about 15 nm, about 25 nm, and about 35 nm, respectively. Thereafter, anisotropic dry etching is performed using the silicon nitride film of the middle layer as the etching stopper to etch the overlying silicon oxide film; and then, the silicon nitride film exposed on the surface is removed by anisotropic dry etching using the underlying silicon oxide film as the etching stopper. Furthermore, the underlying silicon oxide film is removed using wet etching. Thereby, sidewall spacers 38 each composed of a silicon oxide film, a silicon nitride film, and a silicon oxide film are formed on the outside of each sidewall spacer 36.

Next, a source-drain region 10 is formed in each region for LOP, LSTP, and high withstand voltage (Step S28). Here, As ions are implanted using the gate electrode 32, sidewall spacers 38 and the like of each region as masks. Thereafter, heat treatment is performed at about 1050° C. for about 0 second using a so called "spike annealing" to activate the ions. Thereby, the source-drain region 10, which is a diffusion layer having a relatively deep junction depth and a high impurity content is formed in each region.

Furthermore, nickel silicide layers 12 and 34 are formed (Step S30). Here, a nickel (Ni) film is deposited on the surface of the substrate using a sputtering method, and is subjected to heat treatment. Thereby, Si reacts with Ni on the area where Si is exposed; specifically, the surface of each gate electrode 32, and the area of Si substrate 2 above each source-drain region 10. Thereafter, the nickel film that has not reacted is removed to form nickel silicide layers 12 and 34 self-aligned. Thereby, the resistance of the source-drain regions 10 and the gate electrodes 32 can be lowered.

Next, an interlayer insulating film 42 is formed on the entire surface of the substrate (Step S32), and contact plugs 46 are formed in the interlayer insulating film 42 (Step S34). Thus, the SoC 100 as shown in FIG. 1 is formed. Thereafter, a metal film such as a copper film is deposited and a wiring layer is formed using patterning or the like according to a desired circuit constitution to form a desired semiconductor device.

According to the first embodiment, as described above, the insulating film of a laminate structure wherein a high-k film 28 is deposited on silicon oxynitride films 22 and 24 as the gate insulating film of MISFETs 110 and 120 for LOP and LSTP, respectively. Here, by the use of the silicon oxynitride films 22 and 24, the thin gate insulating films having little thickness difference can be uniformly formed. Therefore, the use of such a structure enables a highly reliable semiconductor device to be formed even when both MISFETs for LOP and LSTP must be mounted in a chip.

In the first embodiment, the silicon nitride film in the region for LSTP is removed, leaving the silicon nitride film 50 only in the region for LOP. Thereafter, by performing heat treatment in a nitrogen monoxide atmosphere, the silicon nitride film 50 is oxidized to form a silicon oxynitride film 22 in the region for LOP; on the other hand, a silicon oxynitride film 24 is formed in the region for LSTP. Thus, the use of oxynitride films realizes the formation of highly controlled uniform thin films. Particularly in the first embodiment, by using the silicon nitride film 50, and by using a means for forming an oxynitride film at the same time as the oxidation thereof, highly controlled uniform thin films can be formed even when both the silicon oxynitride films in the region for LOP and the region for LSTP are thin, and have little thickness difference. Thereby, the target value recommended by ITRS for the 65-nm technology can also be achieved.

The nitrogen content of the silicon oxynitride films 22 and 24 formed in the first embodiment is 15 to 20% and 9%, respectively.

For example, if high-k films are laminated on an insulating film to use as a gate insulating film, the high-k films may react with (or mixed to) the underlying films. In this case, there is a problem of increasing of the variation of the thickness, withstand voltage, and the like in the surface of the insulating films, or the occurrence of defect in the boundary of the insulating films, leading to the deterioration of the characteristics of the transistor, and the lowering of the reliability of the semiconductor device. In the first embodiment, however, silicon oxynitride films containing the above-described contents of nitrogen are used as the gate insulating film. Since the mixing of nitrogen in the silicon oxide film can increase the density of the film, the above-described reaction of the insulating film and the high-k film can be inhibited, and a highly reliable semiconductor device can be formed.

Figure 10:
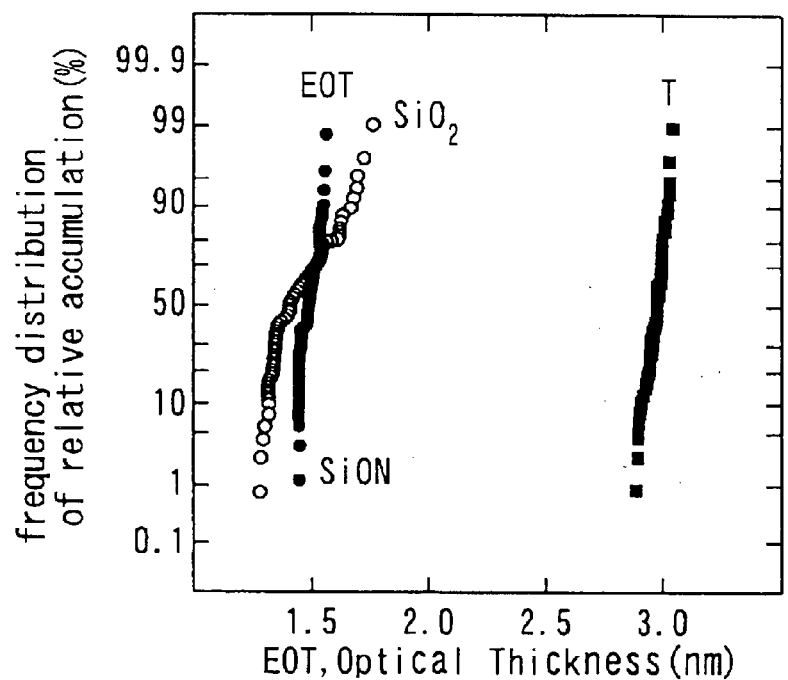
FIG. 10 is a graph showing the film-thickness distribution in the MISFET for LSTP according to the first embodiment of the present invention.
Figure 11:
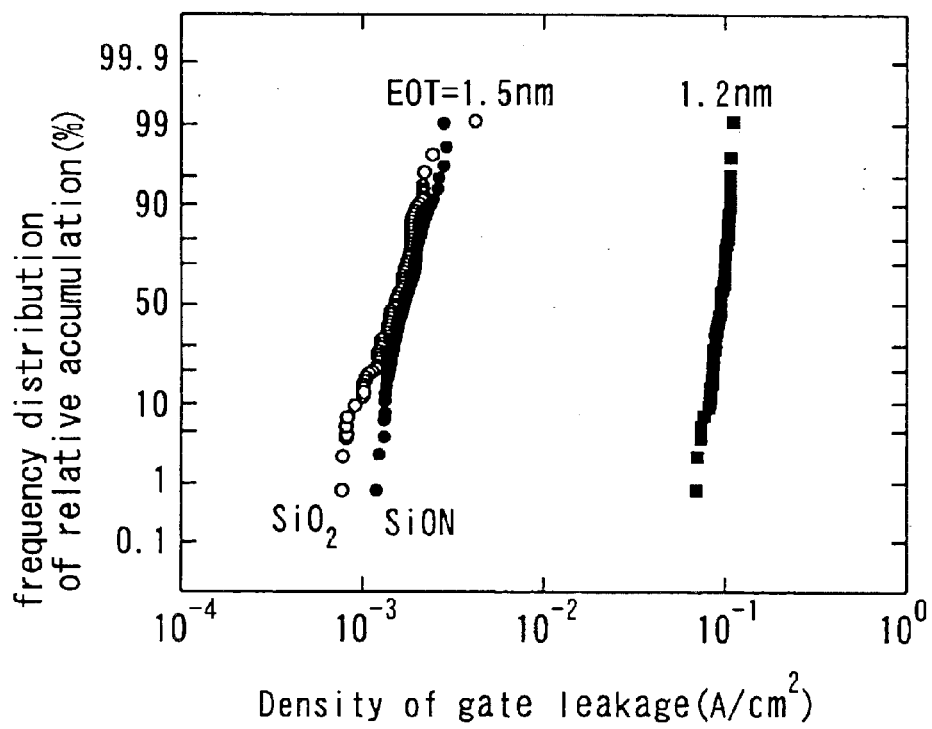
FIG. 11 is a diagram showing the leakage current of the MISFET for LSTP according to the first embodiment of the present invention.

FIG. 10 is a graph showing the film-thickness distribution in the MISFET for LSTP according to the first embodiment. In FIG. 10, the ordinate indicates frequency distribution of relative accumulation (%), and the abscissa indicates EOT of film or optical film thickness (nm). FIG. 11 is a diagram showing the leakage current of the MISFET for LSTP according to the first embodiment. In FIG. 11, the ordinate indicates frequency distribution of relative accumulation (%), and the abscissa indicates the density of leakage current ($A/cm^2$) of each film.

In FIGS. 10 and 11, the line plotted with black circles shows the case of the silicon oxynitride film 24, and the line plotted with black squares shows the case of the high-k film 28. Furthermore, for comparison, the line plotted with white circles shows the case of the conventional $SiO_2$ film without mixing nitrogen.

As FIG. 10 shows, when an silicon oxide film is formed using a conventional method, there is a variation of film thickness as large as about 11%. Therefore, it is considered that it is difficult to form each of two variations of films of which have 0.2 nm to 0.4 nm disparities in the thickness, uniformly, by means of controlling the thickness of interfacial silicon oxide film.

While the thickness of the entire silicon oxynitride film in the first embodiment is about 1.3 nm, and the variation is restricted to about 2.4%. Also, the thickness of the High-k film 28 in the first embodiment is about 3.0 nm, and the variation is restricted to about 2.5%. That is, use of the silicon oxynitride film improves uniformity of films. Therefore, it is possible to form two variations of films on a substrate, uniformly, even if the difference in the thickness of the two films is about 0.2 nm to 0.4 nm.

Referring to FIG. 11 showing leak current in each film, the variation of the leak current in the conventional silicon oxide film is higher. On the other hand, according to the silicon oxynitride film 24 and the high-k film 28 having better uniformity and described in the first embodiment, in both of the gate insulating films of 1.2 nm in EOT and of 1.5 nm in EOT, the variation of the leak currents are lower.

Here, the formation of the high-k film 28, after forming the silicon oxynitride films 22 and 24, and the thermal oxide film 26 as the interfacial gate insulating film of each gate insulating film, can be performed in one step. Therefore, the gate insulating films having different thickness can be easily formed, and the productivity of the semiconductor devices can be improved.

In the first embodiment, the case wherein the silicon nitride film 50 is formed using nitrogen in an ammoniac atmosphere is described. However, the present invention is not limited thereto, but for example, plasma nitridation or radical nitridation may also be used.

Furthermore, in the first embodiment, the case wherein the thickness of the silicon nitride film 50 is about 0.6 nm is described. However, the present invention is not limited thereto, but the adequate thickness may be selected considering the thickness of finally formed silicon oxynitride films for LOP and LSTP, the thickness difference thereof, and increase in thickness during subsequent steps. However, the thickness of the finally required gate insulating film is preferably about 2.0 nm or less in EOT; and therefore, the thickness of the silicon nitride film 50 formed in the ammoniac atmosphere is preferably about 1.0 nm or less. If the silicon nitride film 50 is excessively thin, there is a problem of oxidation resistance, so the thickness of the silicon nitride film 50 is preferably about 0.4 nm or more also for maintaining the thickness difference from the silicon nitride film 50 in the region for LSTP. However, if the problem of oxidation resistance or the like can be evaded, the thickness is not limited thereto.

In the present invention, the temperature and time for the heat treatment when the silicon oxynitride films 22 and 24 are formed are not limited to the temperature and time for the heat treatment described in the first embodiment. In the present invention, the thickness and the thickness difference, or the combination of nitrogen contents of the oxynitride films in the region for LOP and the region for LSTP can be controlled by changing the temperature and time of the heat treatment in nitrogen monoxide. However, when both the control of the nitrogen content in each film and the control of the thickness of the oxynitride film 24 formed in the region for LSTP are considered, the temperature for the heat treatment is preferably within a range between about 700° C. and 1000° C.

In the first embodiment, as the high-k film, the metal oxide film, such as hafnia ($HfO_2$), hafnium aluminate ($Hf_xAl_{1-x}O_y$), alumina ($Al_2O_3$), lanthanum oxide ($La_2O_2$), praseodymium oxide ($Pr_2O_3$), yttrium oxide ($Y_2O_2$), tantalumoxide ($Ta_2O_5$), niobiumoxide ($Nb_2O_5$), titanium oxide ($TiO_2$), and cerium oxide ($CeO_2$), or the nitride thereof, or the solid solution thereof, or the solid solution of these metal oxides and $SiO_2$; or the film of a titanate such as strontium barium titanate (($BaSr)TiO_3$) may also be used. For example, when a hafnium aluminate film is used, it is considered to form the film by an ALD method using trimethyl aluminum, hafnium chloride and water, and by heat treatment at about 1000° C. for about 1 second, in the formation of the high-k film 28 in Step S12 described in the first embodiment. When a hafnium silicon oxinitride film is used, it is considered to form the film by forming the hafnium silicate film and nitridation thereof (annealing in atmosphere of ammonia ($NH_3$)) using ALD method or MOCVD (metal organic chemical vapor deposition) method, in place of Step S12 described in the first embodiment. The method for forming the high-k film is not limited to the ALD method, but other methods, such as a CVD (chemical vapor deposition) method, a sputtering method, a vacuum evaporation method, and the combination of these methods and a reoxidation method, can be used for forming the film.

In the first embodiment, the case wherein a non-doped polycrystalline silicon film is used as the material for the gate electrode 32 is described. However, in the present invention, the material for the gate electrode 32 may be other material.

Furthermore, in the first embodiment, the case wherein an n-type transistor is formed is described. However, the present invention may be applied to the case wherein a p-type transistor is formed. Moreover, within the scope of the present invention, the application of the present invention can be considered to the case wherein both p-type and n-type transistors are formed in one chip.

In the present invention, the parts other than those described above, such as the gate electrode 32, sidewall spacers 36 and 38, the salicide structure using nickel silicide layers 34 and 12, the structure of the semiconductor device such as the source-drain extension 6 and the diffusion layer, and the materials or the manufacturing methods thereof are not limited to those described in the first embodiment within a range not deviated from the scope of the present invention.

Second Embodiment

Figure 12:
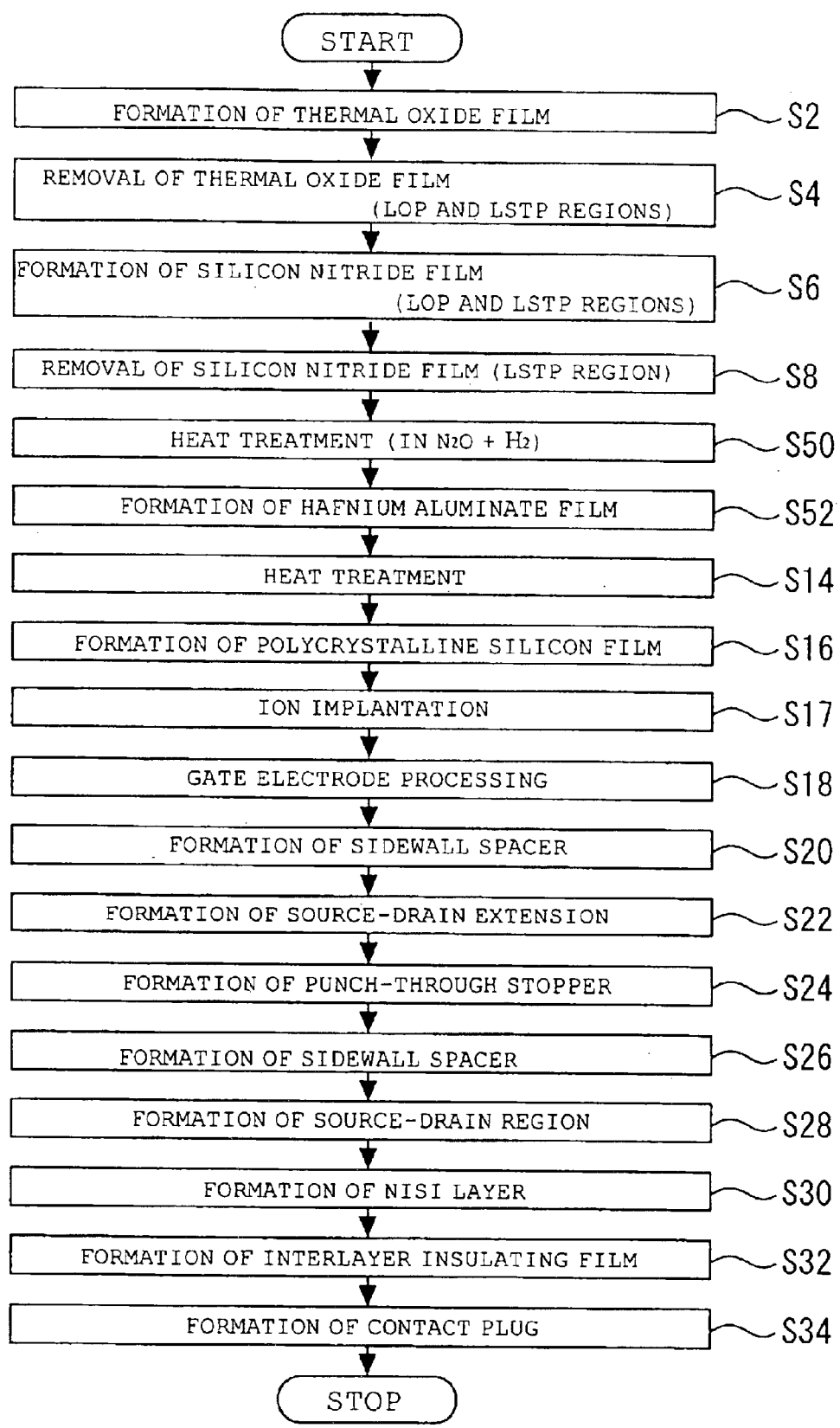
FIG. 12 is a flow diagram for illustrating the method for manufacturing an SoC according to the second embodiment of the present invention.

FIG. 12 is a flow diagram for illustrating the method for manufacturing an SoC according to the second embodiment of the present invention.

The SoC manufactured in the second embodiment is structurally similar to the SoC 100 described in the first embodiment. However, in the SoC of the second embodiment, the EOT of the silicon oxynitride film 22 of the MISFET for LOP 110 is about 0.7 nm, and the nitrogen content in the silicon oxynitride film is 15 to 25%. The thickness of the silicon oxynitride film 24 of the MISFET for LSTP 120 is about 1.0 nm, and the EOT thereof is also about 1.0 nm. The nitrogen content in the silicon oxynitride film 24 is 1% or less.

The method for manufacturing an SoC according to the second embodiment is also similar to the manufacturing method described in the first embodiment.

However, in the second embodiment, the heat treatment in a nitrogen monoxide atmosphere at about 800 to 900° C. for 5 to 60 seconds, described in Step S10 in the first embodiment, is substituted by the heat treatment in a mixed-gas atmosphere of dinitrogen oxide ($N_2O$) and hydrogen ($H_2$) at about 850° C. for 5 seconds (Step S50). By doing this, as described above, a silicon oxynitride film 22 having an EOT of about 0.7 nm, and the nitrogen content of 15 to 25% is formed in the region for LOP; and a silicon oxynitride film 24 of a thickness of about 1.0 nm, and the nitrogen content is 1% or less is formed in the region for LSTP.

Other parts are formed in the same manner as the steps described in the first embodiment.

In the SoC of the second embodiment, as in the SoC of the first embodiment, the thin gate insulating films having little thickness difference can be uniformly formed, by the use of the silicon oxynitride films 22 and 24. Therefore, the use of such a structure enables a highly reliable semiconductor device to be formed even when both MISFETs for LOP and LSTP must be mounted in a chip.

In the second embodiment, by performing heat treatment in a mixed atmosphere of dinitrogen oxide and hydrogen, the silicon nitride film 50 is oxidized to form a silicon oxynitride film 22 in the region for LOP; on the other hand, a silicon oxynitride film 24 is formed in the region for LSTP. Thus, the use of oxynitride films realizes the formation of highly controlled uniform thin films. Particularly in the second embodiment, by using the silicon nitride film 50, and by using a means for forming an oxynitride film at the same time as the oxidation thereof, highly controlled uniform thin films can be formed even when both the silicon oxynitride films in the region for LOP and the region for LSTP are thin, and have little thickness difference. Thereby, the target value recommended by ITRS for the 65-nm technology node can also be achieved.

In other parts, the same effects as in the first embodiment can be obtained.

In the second embodiment, the case wherein the silicon oxynitride film 24 is formed in the mixed atmosphere of dinitrogen oxide and hydrogen. However, the present invention is not limited thereto, but for example, dinitrogen oxide alone may be used. In this case, however, dinitrogen oxide is decomposed to form activated oxygen, and thereby the oxidation rate increases. Therefore the film thickness must be controlled strictly. If the nitrogen content of the silicon oxynitride film 24 is insufficient, nitride treatment such as remote plasma may be carried out to nitride the surface of the silicon oxynitride film 24.

Since other parts are same as those in the first embodiment, the description thereof will be omitted.

For example, in the first and second embodiments, the SoC 100 corresponds to the semiconductor device in the present invention; and the MISFET for LOP 110, the MISFET for LSTP 120, and the MISFET for high withstand voltage 130 correspond to the first, second and third field effect transistors in the present invention, respectively.

Also for example, in the first and second embodiments, the region for LOP, the region for LSTP, and the region for high withstand voltage correspond to the first, second and third element regions in the present invention, respectively.

Also for example, by performing Steps S6 and S8 in the first and second embodiments, the step for forming the silicon nitride film and the step for removing the silicon nitride film of the present invention are performed, respectively. Also by performing Step S10 in the first embodiment, or Step S50 in the second embodiment, the heat treating step of the present invention is performed. Also for example, by performing Step S12 in the first and second embodiments, the step for forming the high-k film of the present invention is performed. Also for example, by performing Steps S2 and S4 in the first and second embodiments, the step for forming the silicon oxide film and the step for removing the silicon oxide film of the present invention are performed, respectively.

The features and the advantages of the present invention as described above may be summarized as follows.

In one aspect of the present invention, a laminate film of a silicon oxynitride film and a high-k film is used as each gate insulating film of a plurality of transistors formed on a substrate. The thickness of the high-k film in each gate insulating film is equalized, and the thickness of silicon oxynitride films in differentiated. Thereby, even if the thickness of the gate insulating films is slightly different, a semiconductor device of highly controlled film thickness can be realized.

Also in another aspect of the present invention, a silicon nitride film is first deposited as the gate insulating film, and then, the silicon nitride film in the region wherein a thick gate insulating film is formed is removed. Thereafter, a silicon oxynitride film is formed in an atmosphere containing nitrogen and oxygen. Then, a high-k film is formed. Thereby, since a slight film thickness difference can be easily controlled by the formation of a the silicon oxynitride film having a highly controlled thickness, a semiconductor device of highly controlled film thickness can be obtained. Also since the formation of dummy electrodes or the like is not required, and the high-k film can be formed in one step, the productivity of semiconductor devices can be improved.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-197954, filed on Jul. 16, 2003 including specification, claims, drawings and summary, on which the Convention priority of the present application is based, are incorporated herein by reference in its entirety.

What is claimed is:

1. A semiconductor device comprising;
   a substrate,
   a first field-effect transistor, including a first gate insulating film and a first gate electrode, on the major surface of said substrate, and
   a second field-effect transistor, including a second gate insulating film and a second gate electrode, on the major surface of said substrate, wherein
   each of said first gate insulating film and said second gate insulating film includes a silicon oxynitride film and a high-dielectric-constant film,
   equivalent-oxide thickness of said first gate insulating film is thicker than equivalent-oxide thickness of said second gate insulating film, and
   the high-dielectric-constant film in said first gate insulating film-has the same thickness as the high-dielectric-constant film in said second gate insulating film.

2. The semiconductor device according to claim 1, wherein the silicon oxynitride film in said first gate insulating film has a higher nitrogen content than the silicon oxynitride film in said second gate insulating film.

3. The semiconductor device according to claim 2, wherein
the nitrogen content of the silicon oxynitride film in said first gate insulating film is in a range from 10% to 30%, and
the nitrogen content of the silicon oxynitride film in said second gate insulating film does not exceed 10%.

4. The semiconductor device according to claim 1, wherein the silicon oxynitride films in said first gate insulating film and in said second gate insulating film both have a thickness in a range from about 0.4 nm to 1.0 nm.

5. The semiconductor device according to claim 1, further comprising a third field-effect transistor including a third gate insulating film and a third gate electrode, wherein
said third gate insulating film includes a silicon oxide film and a high-dielectric-constant film, and
equivalent-oxide thickness of said third gate insulating film is thicker than the equivalent-oxide thickness of said first gate insulating film and said second gate insulating film.

6. The semiconductor device according to claim 5, wherein the silicon oxynitride film in said first gate insulating film has a nitrogen content higher than the nitrogen content of the silicon oxynitride film in said second gate insulating film.

7. The semiconductor device according to claim 6, wherein
the nitrogen content of the silicon oxynitride film in said first gate insulating film is in a range from 10% to 30%, and
the nitrogen content of the silicon oxynitride film in said second gate insulating film does not exceed 10%.

8. The semiconductor device according to claim 5, wherein the silicon oxynitride films in said first gate insulating film and in said second gate insulating film both have a thickness in a range from about 0.4 nm to 1.0 nm.

9. A method for manufacturing a semiconductor device comprising:

separating a major surface of a substrate into a first element region for forming a first field-effect transistor and a second element region for forming a second field-effect transistor, forming a silicon nitride film on said first element region and on said second element region, removing said silicon nitride film formed on said second element region, heat-treating said substrate in an ambient containing nitrogen oxide to oxidize said silicon nitride film formed on said first element region to form an oxynitride film, and to form a silicon oxynitride film on said second element region, and forming a high-dielectric-constant film on the silicon oxynitride film on both of said first element region and said second element region.

10. The method for manufacturing a semiconductor device according to claim 9, including heat-treating in a nitrogen monoxide ambient.

11. The method for manufacturing a semiconductor device according to claim 9, including heat-treating in an ambient of a mixture of dinitrogen oxide and hydrogen.

12. The method for manufacturing a semiconductor device according to claim 9, including separating the major surface of the substrate to include a third element region for forming a third field-effect transistor; and before forming said silicon nitride film, forming a silicon oxide film in each of said first, second, and third element regions, and removing the silicon oxide film formed in each of said first and second element regions.

13. The method for manufacturing a semiconductor device according to claim 12, including heat-treating in an ambient of nitrogen monoxide.

14. The method for manufacturing a semiconductor device according to claim 12, including heat-treating in an ambient of a mixture of dinitrogen oxide and hydrogen.

* * * * *